United States Patent
Chang et al.

(10) Patent No.: US 12,471,350 B2
(45) Date of Patent: Nov. 11, 2025

(54) SEMICONDUCTOR STRUCTURE AND METHOD OF FORMING THE SAME

(71) Applicant: Powerchip Semiconductor Manufacturing Corporation, Hsinchu (TW)

(72) Inventors: Chia-Hao Chang, Taipei (TW); Jih-Wen Chou, Hsinchu (TW); Hwi-Huang Chen, Hsinchu (TW); Hsin-Hong Chen, Hsinchu (TW); Yu-Jen Huang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 503 days.

(21) Appl. No.: 18/080,745

(22) Filed: Dec. 14, 2022

(65) Prior Publication Data
US 2024/0128341 A1    Apr. 18, 2024

(30) Foreign Application Priority Data
Oct. 14, 2022   (TW) .................................. 111139046

(51) Int. Cl.
*H01L 29/423* (2006.01)
*H10D 30/01* (2025.01)
(Continued)

(52) U.S. Cl.
CPC ......... *H10D 64/411* (2025.01); *H10D 30/015* (2025.01); *H10D 30/475* (2025.01); *H10D 64/01* (2025.01)

(58) Field of Classification Search
None
See application file for complete search history.

(56) References Cited

U.S. PATENT DOCUMENTS

2021/0376136 A1\* 12/2021 Akutsu ................ H10D 64/254

FOREIGN PATENT DOCUMENTS

| CN | 111490100 | 8/2020 |
| TW | 202211473 | 3/2022 |

OTHER PUBLICATIONS

Panasonic, "New Contender for the Power Transistor Throne: How Gan is Threatening the Mosfet's Crown", Panasonic Gan Power Transistors Verson 1.0, Apr. 2018, pp. 1-14.
(Continued)

*Primary Examiner* — William C Trapanese
(74) *Attorney, Agent, or Firm* — JCIPRNET (57) ABSTRACT

The disclosure provides a semiconductor structure and a method of forming the same. The semiconductor structure includes a base pattern including a channel region and a drain region, a first semiconductor layer on the channel region of the base pattern, and a gate structure on the first semiconductor layer. The gate structure includes a first stack disposed on the first semiconductor layer and a second stack disposed on the first stack. The first stack includes a first sidewall adjacent to the drain region and a second sidewall opposite to the first sidewall in a first direction parallel to a top surface of the base pattern. The first sidewall is at a first distance from the second stack in the first direction, and the second sidewall is at a second distance from the second stack in the first direction. The first distance is greater than the second distance.

10 Claims, 9 Drawing Sheets

(51) Int. Cl.
*H10D 30/47* (2025.01)
*H10D 64/01* (2025.01)
*H10D 64/27* (2025.01)

(56) References Cited

OTHER PUBLICATIONS

Howard Sin, "Novel GIT Structure Solves Current Collapse In GaN Power HEMTs", How2Power, Sep. 2015, pp. 1-6.
"Office Action of Taiwan Counterpart Application", issued on Sep. 11, 2023, p. 1-p. 6.

* cited by examiner

SEMICONDUCTOR STRUCTURE AND METHOD OF FORMING THE SAME

CROSS-REFERENCE TO RELATED APPLICATION

This application claims the priority benefit of Taiwan application serial no. 111139046, filed on Oct. 14, 2022. The entirety of the above-mentioned patent application is hereby incorporated by reference herein and made a part of this specification.

BACKGROUND OF THE INVENTION

1. Field of the Invention

The invention relates to a semiconductor structure and a method of forming the same, and more particularly, to a semiconductor structure for a high electron mobility transistor.

2. Description of Related Art

A high electron mobility transistor (HEMT) is one kind of transistor that includes a hetero junction formed by two semiconductor materials with different energy gaps. The hetero junction can generate a two-dimensional electron gas (2-DEG) to server as a conductive channel of the HEMT. Since the HEMT has characteristics of low resistance, high breakdown voltage, fast switching frequency, and so on, it is widely used in the field of high-power electronic components.

Generally, the HEMT can be classified as a depletion mode HEMT or an enhancement mode HEMT depending on whether the channel is normally-on or normally-off. The enhancement mode HEMT has gained considerable attention in the industry because of the additional safety and being easier controlled by simple and low-cost driving circuits.

However, in the case where the HEMT applies to the high-power components, the drain of the HEMT is usually applied to a high voltage (e.g., being greater than 100 V), so that make the HEMT encounter issues such as a gate leakage, a time dependent dielectric breakdown (TDDB), or a current collapse. Therefore, the existing high-power components including HEMTs are not entirely satisfactory.

SUMMARY OF THE INVENTION

The present invention provides a semiconductor structure and a method of forming the same in which a gate structure is designed to have an extension portion near a drain side, such that the current collapse can be suppressed during the high voltage operation and thus the device reliability can be improved.

An embodiment of the present invention provides a semiconductor structure including a base pattern, a first semiconductor layer, and a gate structure. The base pattern includes a channel region and a drain region adjacent to the channel region. The first semiconductor layer is disposed on the channel region of the base pattern. The gate structure is disposed on the first semiconductor layer and includes a first stack and a second stack. The first stack is disposed on the first semiconductor layer and includes a second semiconductor layer and a third semiconductor layer on the second semiconductor layer. The second stack is disposed on the first stack and includes a fourth semiconductor layer on the third semiconductor layer and a conductive layer on the fourth semiconductor layer. The first stack includes a first sidewall adjacent to the drain region and a second sidewall opposite to the first sidewall in a first direction parallel to a top surface of the base pattern. The first sidewall is in a first distance from the second stack in the first direction, and the second sidewall is in a second distance from the second stack in the first direction. The first distance and the second distance are positive numbers being greater than 0, and the first distance is greater than the second distance.

In some embodiments, each of the first semiconductor layer and the third semiconductor layer includes a first element doped therein. A concentration of the first element doped in the first semiconductor layer is greater than a concentration of the first element doped in the third semiconductor layer.

In some embodiments, each of the second semiconductor layer and the fourth semiconductor layer includes a second element doped therein. A concentration of the second element doped in the second semiconductor layer is less than a concentration of the second element doped in the fourth semiconductor layer.

In some embodiments, the first distance is about 0.1 lam to about 0.5 lam.

In some embodiments, the semiconductor structure further includes a drain contact disposed on the drain region of the base pattern and including a third stack and an ohmic contact layer. The third stack is disposed on the first semiconductor layer and spaced apart from the first stack. The ohmic contact layer is disposed on the third stack and contacts the drain region of the base pattern.

In some embodiments, the third stack includes a fifth semiconductive layer contacting the first semiconductor layer and a sixth semiconductive layer on the fifth semiconductive layer. A top surface of the fifth semiconductive layer includes a first region contacting the sixth semiconductive layer and a second region contacting the ohmic contact layer.

In some embodiments, a planar area of the second region is greater than a planar area of the first region.

In some embodiments, the fifth semiconductive layer and the second semiconductor layer are made of the same material, and the sixth semiconductive layer and the third semiconductor layer are made of the same material.

In some embodiments, the fourth semiconductor layer includes a third sidewall adjacent to the drain region and a fourth sidewall opposite to the third sidewall in the first direction. The third sidewall is in the first distance from the first sidewall, and the fourth sidewall is in the second distance from the second sidewall.

An embodiment of the present invention provides a method of forming a semiconductor structure, which includes: providing a base pattern including a channel region and a drain region adjacent to the channel region; forming a first semiconductor material layer, a second semiconductor material layer, a third semiconductor material layer, a fourth semiconductor material layer, and a conductive material layer on a top surface of the base pattern subsequentially; patterning the conductive material layer and the fourth semiconductor material layer to form a first stack comprising a conductive layer and a fourth semiconductor layer on the third semiconductor material layer; and patterning the third semiconductor material layer and the second semiconductor material layer to form a second stack and a third stack spaced apart from each other on the first semiconductor material layer, wherein the second stack is between the first semiconductor material layer and the first stack. The second stack includes a first sidewall facing the third stack and a second sidewall opposite to the first sidewall. The first sidewall is in a first distance from the first stack. The second sidewall is in a second distance from the first stack. The first distance and the second distance are positive numbers being greater than 0, and the first distance is greater than the second distance.

In some embodiments, each of the first semiconductor material layer and the third semiconductor material layer includes a first element doped therein. A concentration of the first element doped in the first semiconductor material layer is greater than a concentration of the first element doped in the third semiconductor material layer.

In some embodiments, each of the second semiconductor material layer and the fourth semiconductor material layer includes a second element doped therein. A concentration of the second element doped in the second semiconductor material layer is less than a concentration of the second element doped in the fourth semiconductor material layer.

In some embodiments, the method further includes a step of performing a patterning process on the first semiconductor material layer to form a first semiconductor layer exposing the drain region of the base pattern after forming the second stack and the third stack. A portion of the third stack is removed during the patterning process, so that the third stack is formed to have a staircase structure.

In some embodiments, the method further includes a step of forming an ohmic contact layer on the drain region exposed by the first semiconductor layer. The ohmic contact layer covers the third stack with the staircase structure.

Based on the above, in the aforementioned semiconductor structure and the method of forming the same, the gate structure is designed to have an extension portion near a drain side, so that the current collapse can be suppressed during the high voltage operation and thus the device reliability can be improved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

FIG. 1A to FIG. 1I are schematic cross-section views illustrating a method of forming a semiconductor structure of an embodiment of the present invention.

In some embodiments, a method of forming a semiconductor structure (e.g., a semiconductor structure 10 shown in FIG. 1I) may include the following steps.

Figure 1A:
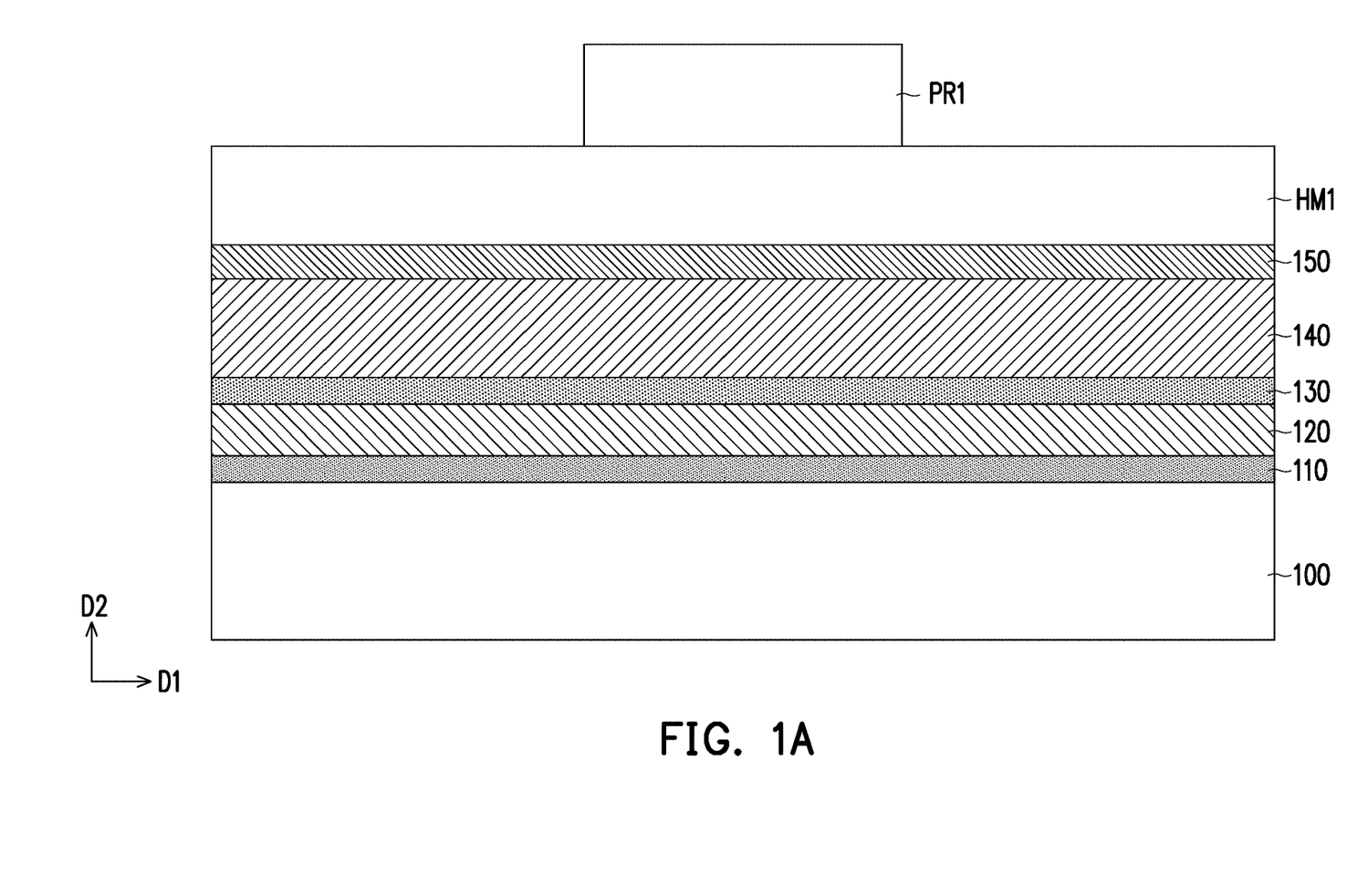
FIG. 1A to FIG. 1I are schematic cross-section views illustrating a method of forming a semiconductor structure of an embodiment of the present invention.

Firstly, referring to FIG. 1A, a base pattern 100 is provided. The base pattern 100 may include a channel region (e.g., a channel region CH shown in FIG. 1I) and a source region (e.g., a source region SR shown in FIG. 1I) and a drain region (e.g., a drain region DR shown in FIG. 1I) adjacent to the channel region. The channel region may be disposed between the source region and the drain region. In some embodiments, the base pattern 100 may be a fin pattern formed on a substrate. The substrate may include a semiconductor substrate or a semiconductor on insulator (SOI) substrate. Semiconductor materials in the semiconductor substrate or in the SOI substrate may include element semiconductors, alloy semiconductors, or compound semiconductors. For example, the element semiconductors may include Si or Ge. The alloy semiconductors may include SiGe, SiGeC, or the like. The compound semiconductors may include SiC, III-V semiconductor materials, or II-VI semiconductor materials. The III-V semiconductor materials may include GaN, GaP, GaAs, AlN, AlP, AlAs, InN, InP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, or InAlPAs. The II-VI semiconductor materials may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The semiconductor materials may be doped with dopants having a first conductivity type or dopants having a second conductivity type complementary to the first conductivity type. For example, the first conductivity type may be N type, and the second conductivity type may be P type.

The base pattern 100 may include group III nitrides or III-V compound semiconductor materials. For example, the base pattern 100 may include GaN. Methods of forming the base pattern 100 may include an epitaxial process. In some embodiments, the top surface of the base pattern 100 may be a polar surface, so that a hetero junction formed by the base pattern 100 and another group III nitride or III-V compound semiconductor material can generate spontaneous polarization and piezoelectric polarization effects, and thus a high concentration of two-dimensional electron gas (2-DEG) is formed near the interface.

Next, a first semiconductor material layer 110, a second semiconductor material layer 120, a third semiconductor material layer 130, a fourth semiconductor material layer 140, and a conductive material layer 150 are formed on the top surface of the base pattern 100 subsequentially.

A material of the first semiconductor material layer 110 may include a group III nitride or a III-V compound semiconductor material. For example, the material of the first semiconductor material layer 110 may include InAlGaN, AlGaN, AlInN, AlN, or a combination thereof. The hetero junction formed by the first semiconductor material layer 110 and a portion of the base pattern 100 that has the polar surface can generate 2-DEG by the spontaneous polarization and piezoelectric polarization effects. The 2-DEG may be located in a region of the base pattern 100 near an interface between the base pattern 100 and the first semiconductor material layer 110. In some embodiments, the first semiconductor material layer 110 may be formed by a metal organic chemical vapor deposition (MOCVD) process, for example. In some embodiments, the thickness of the first semiconductor material layer 110 may be about 10 nm to about 20 nm.

A material of the second semiconductor material layer 120 may include, for instance, a p-type doped GaN (p-GaN). The second semiconductor material layer 120 may be formed on the first semiconductor material layer 110 by MOCVD process, for example. In some embodiments, the p-type doped GaN may be formed by doping a p-type dopant (e.g., Mg) into the GaN. In some embodiments, the thickness of the second semiconductor material layer 120 may be about 20 nm to about 35 nm. In some embodiments, the second semiconductor material layer 120 (e.g., p-GaN) may server as a polar modulation layer to modulate the dipole concentration of the first semiconductor material layer 110 (e.g., AlGaN), such that the carrier concentration of 2-DEG in the channel region may be depleted.

A material of the third semiconductor material layer 130 may include group III nitrides or III-V compound semiconductor materials. For example, the material of the third semiconductor material layer 130 may include InAlGaN, AlGaN, AlInN, AlN, or a combination thereof. In some embodiments, the third semiconductor material layer 130 may be formed, for example, by the MOCVD process. In some embodiments, the thickness of the third semiconductor material layer 130 may be about 2 nm to about 4 nm.

A method of the fourth semiconductor material layer 140 may include, for example, a p-type doped GaN (p-GaN). The fourth semiconductor material layer 140 may be formed on the third semiconductor material layer 130 by the MOCVD process, for example. In some embodiments, the p-type doped GaN may be formed by doping a p-type dopant (e.g., Mg) into the GaN. In some embodiments, the thickness of the fourth semiconductor material layer 140 may be about 50 nm to about 60 nm. In some embodiments, the second semiconductor material layer 120 and the fourth semiconductor material layer 140 (e.g., p-GaN) formed over the first semiconductor material layer 110 may serve as the polar modulation layers to modulate the dipole concentration of the first semiconductor material layer 110 (e.g., AlGaN), such that the carrier concentration of 2-DEG in the channel region may be depleted.

In some embodiments, each of the first semiconductor material layer 110 and the third semiconductor material layer 130 may include a first element (e.g., Al) doped therein. In some embodiments, a concentration of the first element doped in the first semiconductor material layer 110 or the third semiconductor material layer 130 may be about 10% to about 35%. In some embodiments, a concentration of the first element doped in the first semiconductor material layer 110 may be greater than a concentration of the first element doped in the third semiconductor material layer 130. In some embodiments, each of the second semiconductor material layer 120 and the fourth semiconductor material layer 140 may include a second element (e.g., Mg) doped therein. In some embodiments, a concentration of the second element doped in the second semiconductor material layer 120 may be less than a concentration of the second element doped in the fourth semiconductor material layer 140.

The conductive material layer 150 may include TiN. The conductive material layer 150 may be formed on the fourth semiconductor material layer 140 by a physical vapor deposition (PVD) process, for example.

Figure 1B:
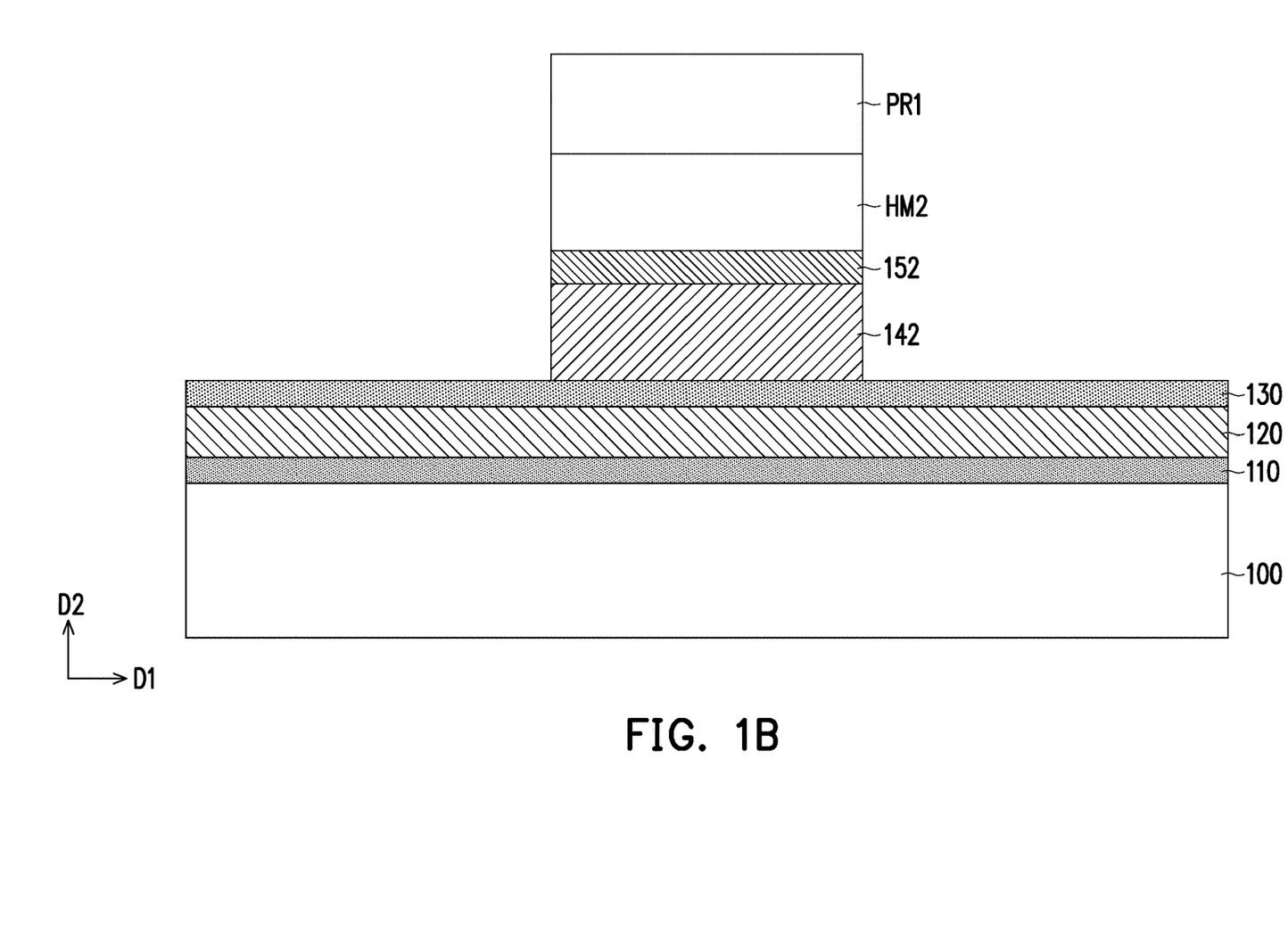
Figure 1C:
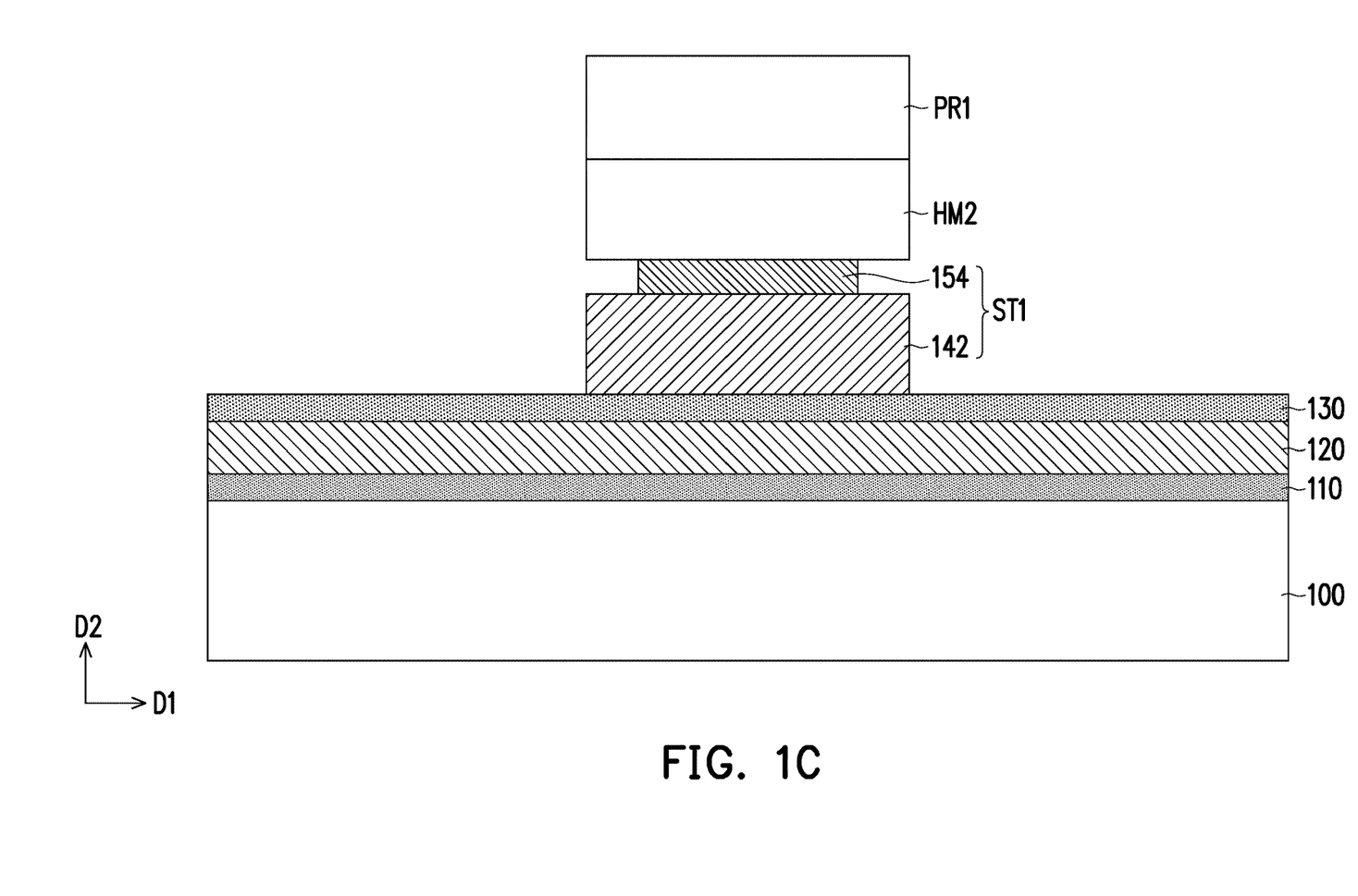

Next, referring to FIG. 1A to FIG. 1C, the conductive material layer 150 and the fourth semiconductor material layer 140 are patterned to form a first stack ST1 including a conductive layer 154 and a fourth semiconductor layer 142 on the third semiconductor material layer 130. In some embodiments, the first stack ST1 are formed, for example, by the following steps.

Firstly, referring to FIG. 1A, a hard mask layer HM1 and a photoresist pattern PR1 are formed on the conductive material layer 150 sequentially. Next, referring to FIG. 1A and FIG. 1B, a portion of the hard mask layer HM1 exposed by the photoresist pattern PR1 and a portion of the conductive material layer 150 and a portion of the fourth semiconductor material layer 140 that are located below the portion of the hard mask layer HM1 are removed by using the photoresist pattern PR1 as a mask, so as to form a hard mask pattern HM2, a conductive layer 152, and a fourth semiconductor layer 142. In some embodiments, the third semiconductor material layer 130 may server as a stop layer for removing the portion of the fourth semiconductor material layer 140. Then, referring to FIG. 1B and FIG. 1C, a portion of the conductive layer 152 is removed laterally in a direction parallel to the top surface of the base pattern 100 to form a conductive layer 154. In some embodiments, the opposite sidewalls of the conductive layer 154 in the first direction D1 are positioned on the top surface of the fourth semiconductor layer 142 and are not aligned with the opposite sidewalls of the fourth semiconductor layer 142 in the first direction D1. Namely, the fourth semiconductor layer 142 may include a portion overlapping the conductive layer 154 and another portion that is not overlapping the conductive layer 154, such that the issue of gate leakage can be improved. In some embodiments, the conductive layer 152 may be etched laterally by wet etching, for example, to form the conductive layer 154. After that, the photoresist pattern PR1 and the hard mask pattern HM2 are removed (as shown in FIG. 1D) after the conductive layer 154 and the fourth semiconductor layer 142 are formed.

Figure 1D:
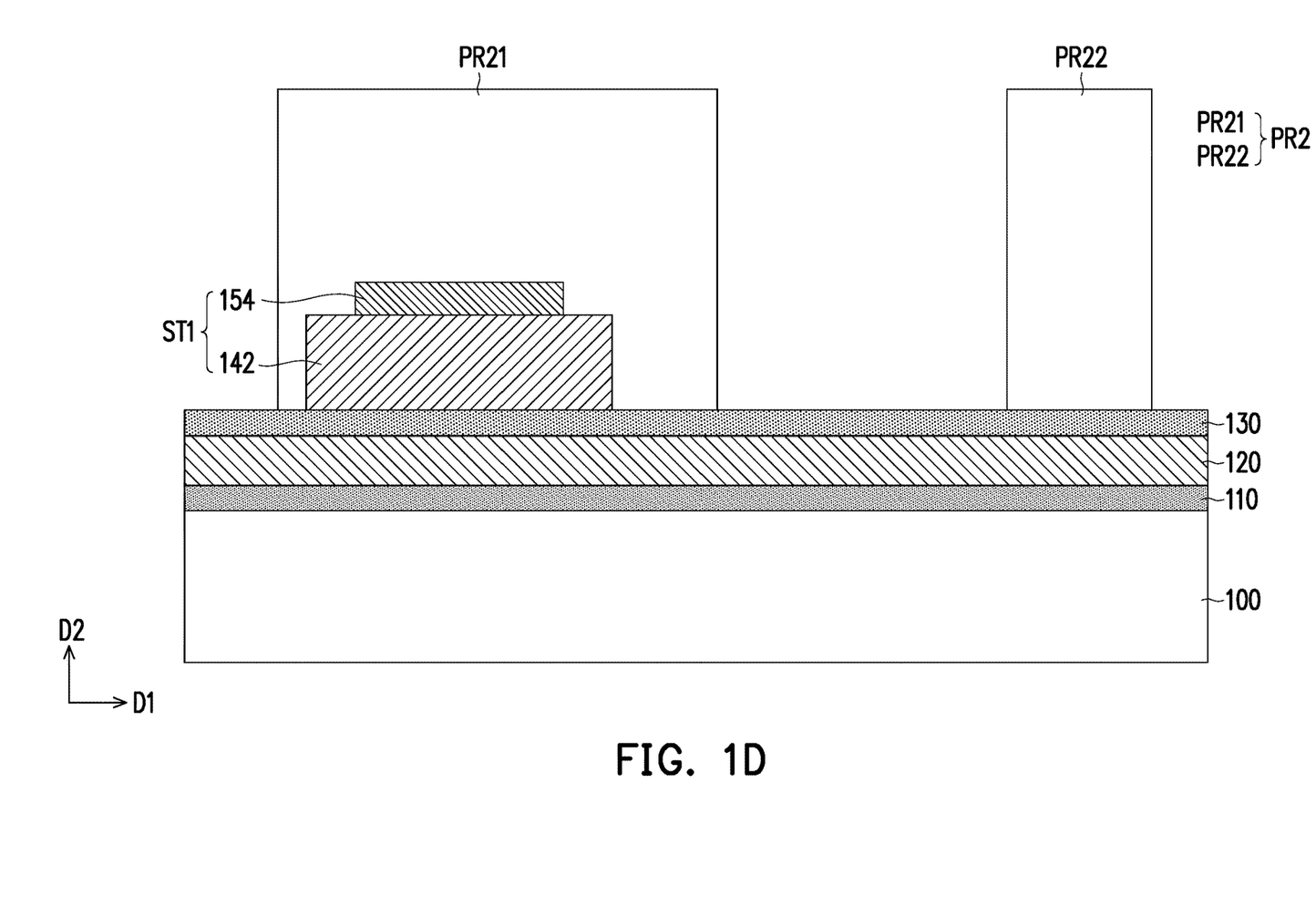
Figure 1E:
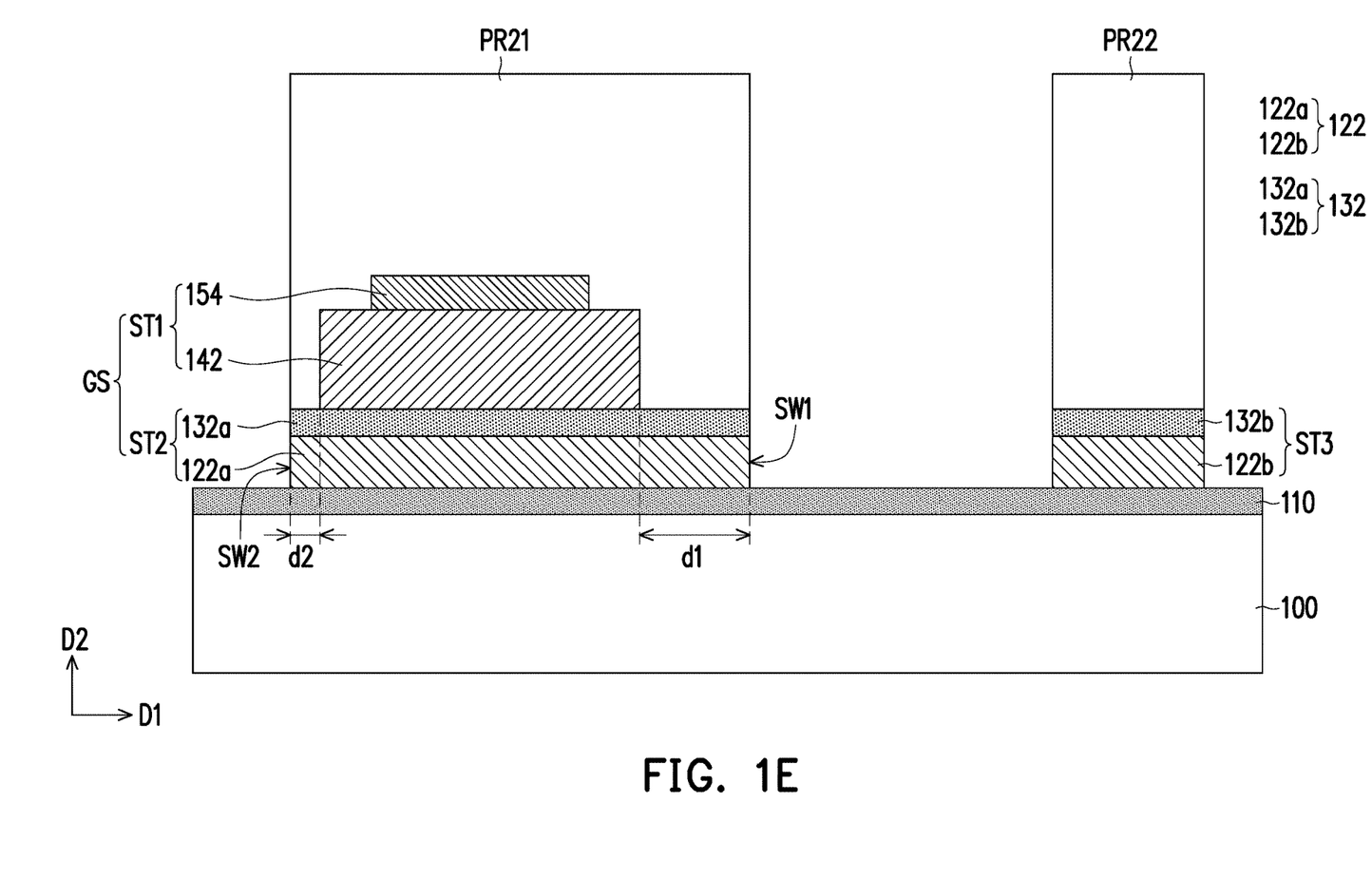

Then, referring to FIG. 1C to FIG. 1E, the third semiconductor material layer 130 and the second semiconductor material layer 120 are patterned to form a second stack ST2 and a third stack ST3 spaced apart from each other on the first semiconductor material layer 110. The second stack ST2 is between the first semiconductor material layer 110 and the first stack ST1 and includes a first portion 122a of a second semiconductor layer 122 and a first portion 132a of a third semiconductor layer 132. The third stack ST3 includes a second portion 122b of the second semiconductor layer 122 and a second portion 132b of the third semiconductor layer 132. The second stack ST2 includes a first sidewall SW1 facing the third stack ST3 and a second sidewall SW2 opposite the first sidewall SW1. The first sidewall SW1 is in a first distance d1 from the first stack ST1, and the second sidewall SW2 is in a second distance d2 from the first stack ST1, wherein the first distance d1 and the second distance d2 are positive numbers being greater than 0, and the first distance d1 is greater than the second distance d2. Accordingly, the second stack ST2 of a gate structure GS can have an extension portion (second stack ST2 being referred to as LDD structure) at the side facing the drain (e.g., drain region DR shown in FIG. 1I), such that the current collapse can be suppressed during the high voltage operation and thus the device reliability can be improved. On the other hand, the 2-DEG profile is redistributed by the second stack ST2, so that the TDDB of the semiconductor device can be improved. In some embodiments, the second stack ST2 and the third stack ST3 may be formed, for example, by the following steps.

Firstly, referring to FIG. 1D, a photoresist pattern PR1 is formed on the third semiconductor material layer 130. The photoresist pattern PR2 includes first pattern PR21 covering the first stack ST1 and a second pattern PR22 spaced apart from the first pattern PR21. The first pattern PR21 includes a first sidewall facing the second pattern PR22 and a second sidewall opposite to the first sidewall. The distance (e.g., the first distance d1 shown in FIG. 1E) between the first sidewall of the first pattern PR21 and the first stack ST1 is greater than the distance (e.g., the second distance d2 shown in FIG. 1E) between the second sidewall of the first pattern PR21 and the first stack ST1. Next, referring to FIG. 1E, a portion of the third semiconductor material layer 130 that is exposed by the photoresist pattern PR2 and a portion of the second semiconductor material layer 120 under the portion of the third semiconductor material layer 130 are removed by using the photoresist pattern PR2 as a mask to form a third semiconductor layer 132 and a second semiconductor layer 122. A first portion 122a of the second semiconductor layer 122 and a first portion 132a of the third semiconductor layer 132 constitute the second stack ST2, and a second portion 122b of the second semiconductor layer 122 and a second portion 132b of the third semiconductor layer 132 constitute the third stack ST3.

Figure 1F:
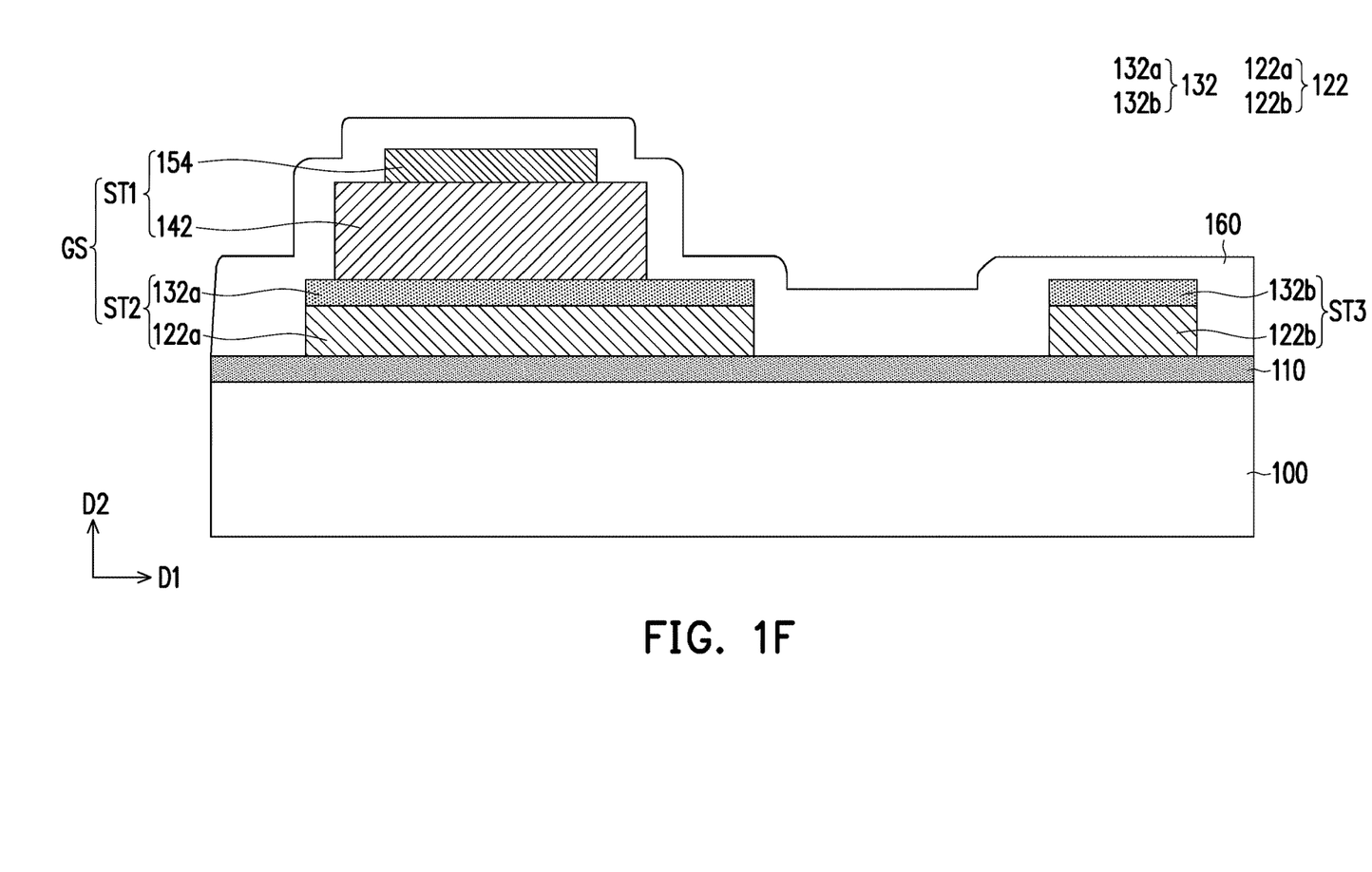

After that, referring to FIG. 1E and FIG. 1F, the photoresist pattern PR2 is removed after forming the second stack ST2 and the third stack ST3. Then, a passivation material layer 160 covering the first stack ST1, the second stack ST2, and the third stack ST3 is formed on the first semiconductor material layer 110. The passivation material layer 160 may be conformally formed on the first semiconductor material layer 110, the first stack ST1, the second stack ST2, and the third stack ST3. The passivation material layer 160 may include a silicon oxide, a silicon nitride, a silicon oxynitride, a carbon-doped silicon oxide, a carbon-doped silicon nitride, a carbon-doped silicon oxynitride, a zinc oxide, a zirconium oxide, a hafnium oxide, a titanium oxide, or a combination thereof. The passivation material layer 160 may formed, for example, by a chemical vapor deposition (CVD) process. In some embodiments, the thickness of the passivation material layer 160 may be about 150 nm to about 300 nm.

Figure 1G:
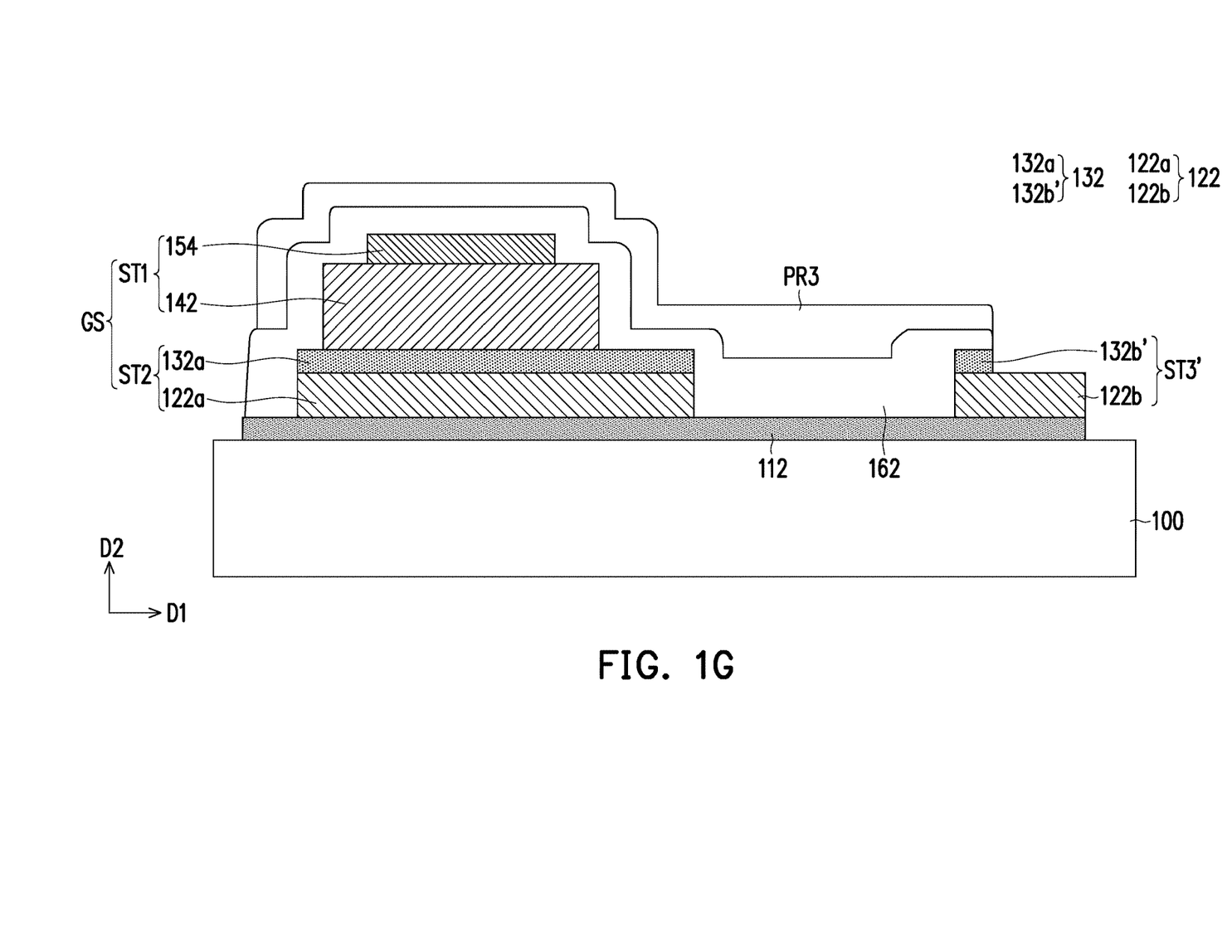

Then, referring to FIGS. 1F and 1G, a patterning process is performed on the passivation material layer 160 and the first semiconductor material layer 110 to form a first semiconductor layer 112 and a passivation layer 162. In some embodiments, a portion of the third stack ST3 is removed during the above patterning process, so that the third stack ST3' is formed to have staircase structure (as shown in FIG. 1G). For example, the above patterning process may include the following steps. Firstly, a photoresist pattern PR3 is formed on the passivation material layer 160. The photoresist pattern PR3 may at least cover the first stack ST1, the second stack ST2, a portion of the third stack ST3, and a portion of the first semiconductor material layer 110 that is located between the first stack ST1 and the third stack ST3. Next, a portion of the passivation material layer 160 exposed by the photoresist pattern PR3 and a portion of the first semiconductor material layer 110 under the portion of the passivation material layer 160 are removed by using the photoresist pattern PR3 as a mask to form the first semiconductor layer 112 and the passivation layer 162. During a step of removing the portion of the first semiconductor material layer 110, the second portion 132b of the third semiconductor layer 132 of the third stack ST3 is removed, so that the third stack ST3' is formed to have the staircase structure. The third stack ST3' may include the second portion 122b of the second semiconductor layer 122 and a second portion 132b' of the third semiconductor layer 132.

In some embodiments, in a step of removing the above passivation material layer 160, the first semiconductor material layer 110 and the second portion 132b of the third semiconductor layer 132 of the third stack ST3 may be served as an etching stop layer. From here, the second portion 132b of the third semiconductor layer 132 can prevent the second portion 122b of the second semiconductor layer 122 from being damaged in the step of removing the passivation material layer 160, and the boundary of the photoresist pattern PR3 only needs to be positioned above the second portion 132b of the third semiconductor layer 132 (there is no need to be aligned with the sidewall of the second portion 122b of the second semiconductor layer 122), so the above processes have good process window. In some embodiments, in a step of removing the first semiconductor material layer 110 and the second portion 132b of the third semiconductor layer 132, the base pattern 100 and the second portion 122b of the second semiconductor layer 122 of the third stack ST3 may be served as an etching stop layer.

Figure 1H:
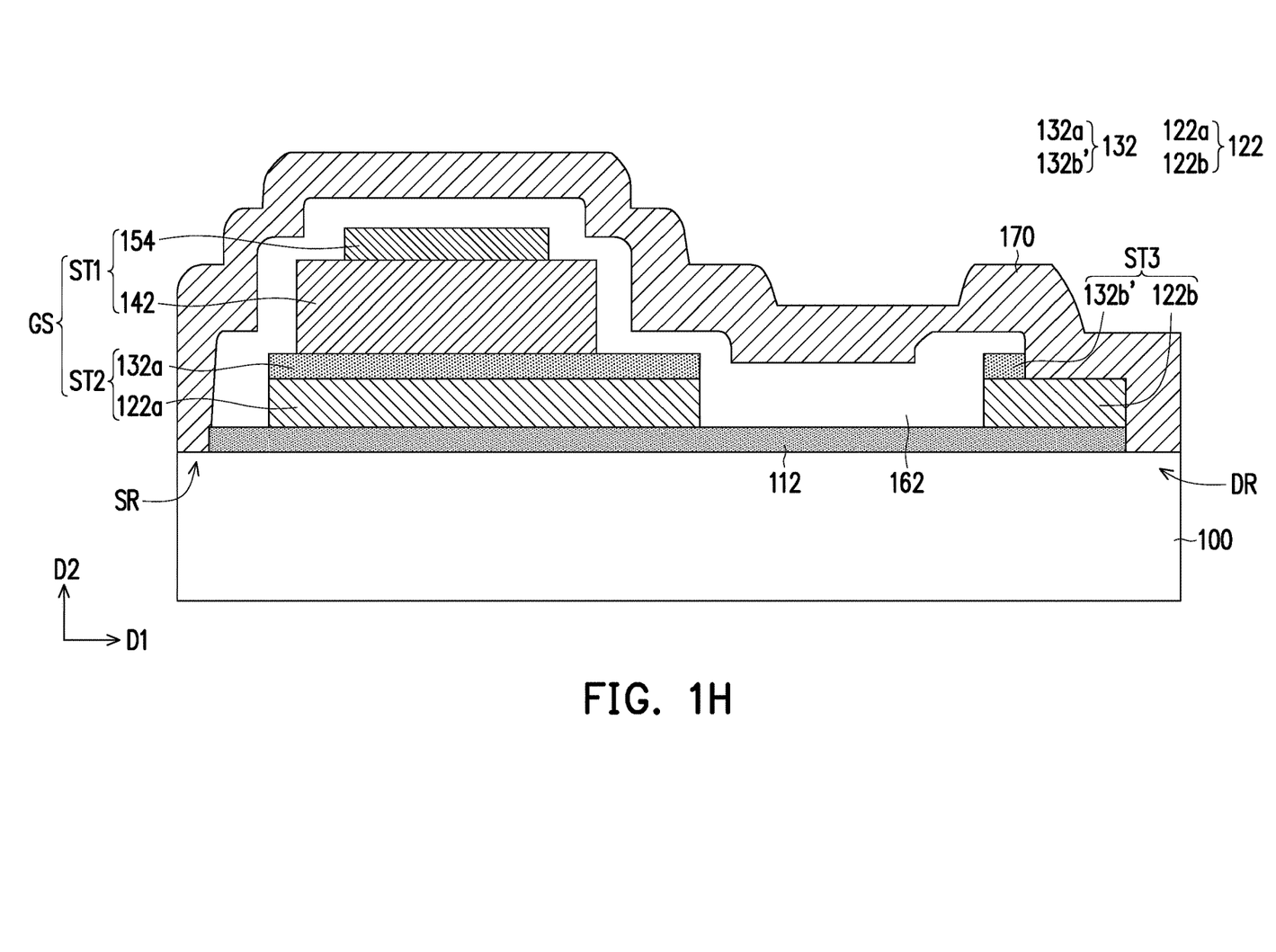

After that, referring to FIG. 1G and FIG. 1H, an ohmic contact material layer 170 is formed on the passivation layer 162, a portion of the base pattern 100 that is exposed by the passivation layer 162 (e.g., the source region SR and the drain region DR), and a portion of the third stack ST3'. A material of the ohmic contact material layer 170 may be, for example, a metal, a metal nitride, a metal silicide, or other suitable materials.

Figure 1I:
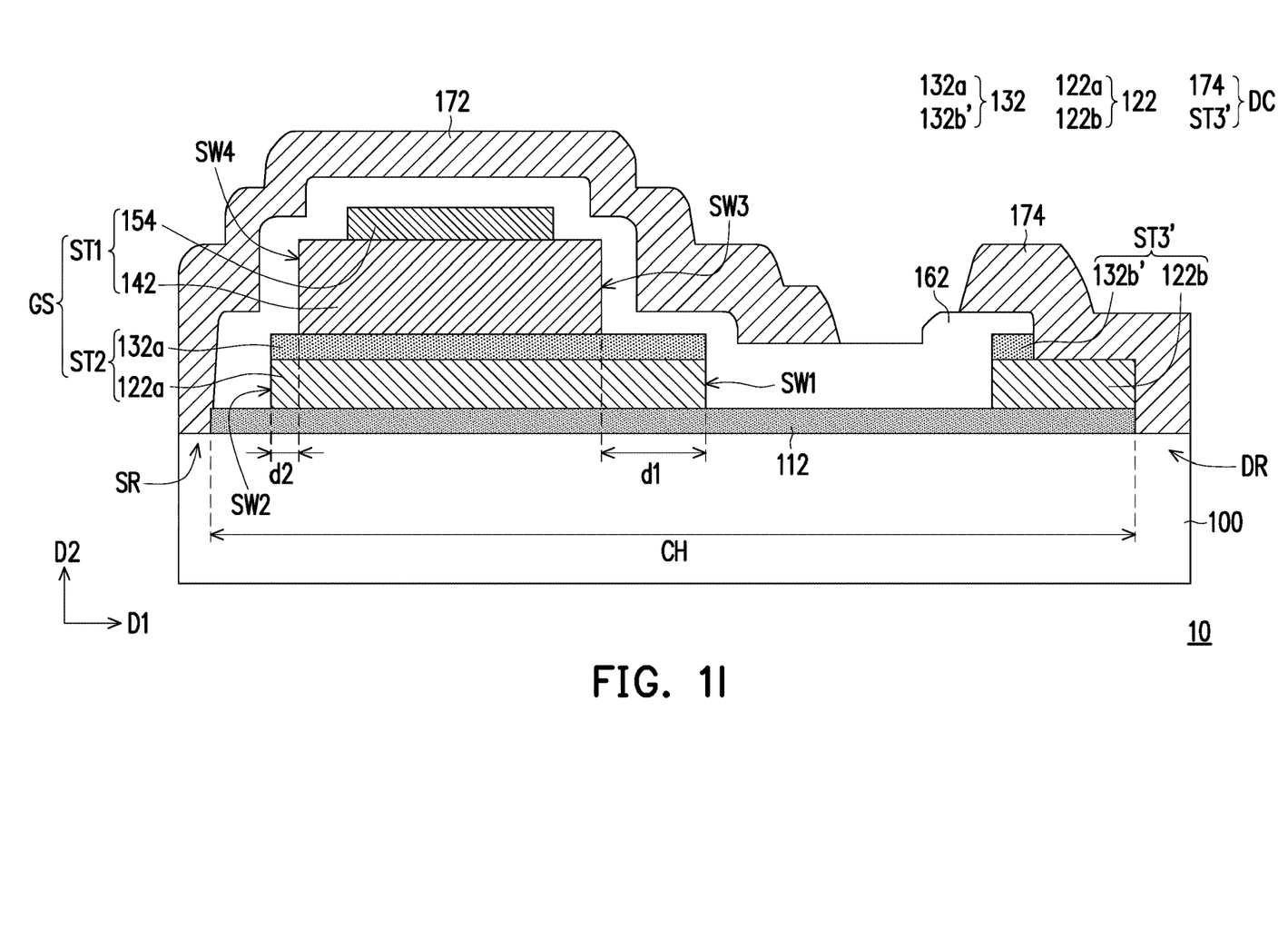

Then, referring to FIG. 1H and FIG. 1I, the ohmic contact material layer 170 is patterned to form an ohmic contact layer 172 and an ohmic contact layer 174 spaced apart from each other. The ohmic contact layer 172 is formed on gate structure GS and extends to the source region SR. The ohmic contact layer 174 is formed on the drain region DR exposed by the passivation layer 162 and covers the third stack ST3' having the staircase structure. The third stack ST3' and the ohmic contact layer 174 may constitute a drain contact DC. In the case where the semiconductor device is in the off-state, the second portion 122b of the second semiconductor layer 122 of the third stack ST3' can generate additional holes to compensate the deficiencies of the buffer layer under the drain contact DC (e.g., the first semiconductor layer 112 under the drain contact DC to the region above the substrate) and reduce excessive negative charges presented in the interface channel (e.g., an interface of AlGaN and GaN) between the gate structure GS and the drain region DR. In the case where the semiconductor device is in the on-state, the second portion 122b of the second semiconductor layer 122 of the third stack ST3' can generate additional holes to recombine the hot electrons, so that the gate leakage can be improved and the issue of the electric field collapsed due to the electric field gathering at the gate and drain ends can be prevented. In addition to the above advantages, the size of the semiconductor device may be decreased by about 9% for example.

Hereinafter, the semiconductor structure 10 will be illustrated with reference to FIG. 1I, but the method of forming the semiconductor structure 10 of the present invention is not limited thereto. In addition, the same or similar components are denoted by the same or similar reference numerals, which are not repeated in the following.

Referring to FIG. 1I, a semiconductor structure 10 includes a base pattern 100, a first semiconductor layer 112, and a gate structure GS. The base pattern 100 includes a channel region CH and a drain region DR and a source region SR that are adjacent to the channel region CH, wherein the channel region CH is between the drain region DR and the source region SR. The first semiconductor layer 112 is disposed on the channel region CH of the base pattern 100. The gate structure GS is disposed on the first semiconductor layer 112 and include a first stack (e.g., ST2 shown in FIG. 1I and being referred to stack ST2) and a second stack (e.g., ST1 shown in FIG. 1I and being referred to stack ST1). The stack ST2 is disposed on the first semiconductor layer 112 and includes a second semiconductor layer 122a and a third semiconductor layer 132a on the second semiconductor layer 122a. The stack ST1 is disposed on the stack ST2 and includes a fourth semiconductor layer 142 on the third semiconductor layer 132a and a conductive layer 154 on the fourth semiconductor layer 142. The stack ST2 includes a first sidewall SW1 adjacent to the drain region DR and a second sidewall SW2 opposite to the first sidewall SW1 in a first direction parallel to the top surface of the base pattern 100. The first sidewall SW1 is in a first distance d1 from the stack ST1 in the first direction D1. The second sidewall SW2 is in a second distance d2 from the stack ST1 in the first direction D1. The first distance d1 and the second distance d2 are positive numbers being greater than 0, and the first distance d1 is greater than the second distance d2. As such, the gate structure GS can have an extension portion near a drain side (e.g., drain region DR), so that the current collapse can be suppressed during the high voltage operation and thus the device reliability can be improved. In some embodiments, the first distance d1 may be about 0.1 µm to about 0.5 µm.

In some embodiments, the fourth semiconductor layer 142 may include a third sidewall SW3 adjacent to the drain region DR and a fourth sidewall SW4 opposite to the third sidewall SW3 in the first direction D1. The third sidewall SW3 may be in the first distance d1 from the first sidewall SW1, and the fourth sidewall may be in the second distance d2 from the second sidewall SW2.

In some embodiments, each of the first semiconductor layer 112 and the third semiconductor layer 132a includes a first element (e.g., Al) doped therein. In some embodiments, a concentration of the first element doped in the first semiconductor layer 112 is greater than a concentration of the first element doped in the third semiconductor layer 132a. As such, the gate leakage can be suppressed, and the threshold voltage can also be controlled by adjusting the doping concentration of the first element.

In some embodiments, each of the second semiconductor layer 122a and the fourth semiconductor layer 142 include a second element (e.g., Mg) doped therein. In some embodiments, a concentration of the second element doped in the second semiconductor layer 122a is less than a concentration of the second element doped in the fourth semiconductor layer 142. As such, the threshold voltage can be controlled by adjusting the doping concentration of the second element, and it can also produce effects such as LDD with the first semiconductor layer 112 to disperse the electric field distribution of the channel region CH between the gate and the drain and thus the component failure caused by the collapse due to excessive electric field concentration can be prevented.

In some embodiments, the semiconductor structure 10 may include a drain contact DC disposed on the drain region DR of the base pattern 100. The drain contact DC may include a stack ST3' and an ohmic contact layer 174. The stack ST3' is disposed on the first semiconductor layer 112 and is spaced apart from the stack ST2. The ohmic contact layer 174 is disposed on the stack ST3' and contacts the drain region DR of the base pattern 100. In some embodiments, the stack ST3' may include a fifth semiconductive layer 122b contacting the first semiconductor layer 112 and a sixth semiconductive layer 132b' on the fifth semiconductive layer 122b. The top surface of the fifth semiconductive layer 122b includes a first region contacting the sixth semiconductive layer 132b' and a second region contacting the ohmic contact layer 174. In some embodiments, a planar area of the second region is greater than a planar area of the first region.

In some embodiments, the fifth semiconductive layer 122b and the second semiconductor layer 122a may be made of the same material. As such, the second semiconductor layer 122a and the fifth semiconductive layer 122b may be referred to as the first portion 122a of the second semiconductor layer 122 and the second portion 122b of the second semiconductor layer 122, respectively, as described above. In some embodiments, the sixth semiconductive layer 132b' and the third semiconductor layer 132a may be made of the same material. As such, the third semiconductor layer 132a and the sixth semiconductive layer 132b' may be referred to as the first portion 132a of the third semiconductor layer 132 and the second portion 132b' of the third semiconductor layer 132, respectively, as described above.

Based on the above, in the foregoing semiconductor structure and the method of forming the same, the gate structure is designed to have an extension portion near a drain side, so that the current collapse can be suppressed during the high voltage operation and thus the device reliability can be improved.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor structure, comprising:
a base pattern comprising a channel region and a drain region adjacent to the channel region;
a first semiconductor layer disposed on the channel region of the base pattern; and
a gate structure disposed on the first semiconductor layer and comprising:
a first stack disposed on the first semiconductor layer and comprising a second semiconductor layer and a third semiconductor layer on the second semiconductor layer; and
a second stack disposed on the first stack and comprising a fourth semiconductor layer on the third semiconductor layer and a conductive layer on the fourth semiconductor layer,
wherein the first stack comprises a first sidewall adjacent to the drain region and a second sidewall opposite to the first sidewall in a first direction parallel to a top surface of the base pattern, the first sidewall is in a first distance from the second stack in the first direction, the second sidewall is in a second distance from the second stack in the first direction, the first distance and the second distance are positive numbers being greater than 0, and the first distance is greater than the second distance,
wherein each of the first semiconductor layer and the third semiconductor layer comprises a first element doped therein, and a concentration of the first element doped in the first semiconductor layer is greater than a concentration of the first element doped in the third semiconductor layer, and
wherein each of the second semiconductor layer and the fourth semiconductor layer comprises a second element doped therein, a concentration of the second element doped in the second semiconductor layer is less than a concentration of the second element doped in the fourth semiconductor layer.

2. The semiconductor structure of claim 1, wherein the first distance is about 0.1 μm to about 0.5 μm.

3. The semiconductor structure of claim 1, further comprising:
a drain contact disposed on the drain region of the base pattern and comprising:
a third stack disposed on the first semiconductor layer and spaced apart from the first stack; and an ohmic contact layer disposed on the third stack and contacting the drain region of the base pattern.

4. The semiconductor structure of claim 3, wherein the third stack comprises a fifth semiconductive layer contacting the first semiconductor layer and a sixth semiconductive layer on the fifth semiconductive layer, and a top surface of the fifth semiconductive layer comprises a first region contacting the sixth semiconductive layer and a second region contacting the ohmic contact layer.

5. The semiconductor structure of claim 4, wherein a planar area of the second region is greater than a planar area of the first region.

6. The semiconductor structure of claim 3, wherein the fifth semiconductive layer and the second semiconductor layer are made of the same material, and the sixth semiconductive layer and the third semiconductor layer are made of the same material.

7. The semiconductor structure of claim 1, wherein the fourth semiconductor layer comprises a third sidewall adjacent to the drain region and a fourth sidewall opposite to the third sidewall in the first direction, the third sidewall is in the first distance from the first sidewall, and the fourth sidewall is in the second distance from the second sidewall.

8. A method of forming a semiconductor structure, comprising:
providing a base pattern comprising a channel region and a drain region adjacent to the channel region;
forming a first semiconductor material layer, a second semiconductor material layer, a third semiconductor material layer, a fourth semiconductor material layer, and a conductive material layer on a top surface of the base pattern subsequentially;
patterning the conductive material layer and the fourth semiconductor material layer to form a first stack comprising a conductive layer and a fourth semiconductor layer on the third semiconductor material layer; and
patterning the third semiconductor material layer and the second semiconductor material layer to form a second stack and a third stack spaced apart from each other on the first semiconductor material layer, wherein the second stack is between the first semiconductor material layer and the first stack,
wherein the second stack comprises a first sidewall facing the third stack and a second sidewall opposite to the first sidewall, the first sidewall is in a first distance from the first stack, the second sidewall is in a second distance from the first stack, the first distance and the second distance are positive numbers being greater than 0, and the first distance is greater than the second distance,
wherein each of the first semiconductor material layer and the third semiconductor material layer comprises a first element doped therein, a concentration of the first element doped in the first semiconductor material layer is greater than a concentration of the first element doped in the third semiconductor material layer, and
wherein each of the second semiconductor material layer and the fourth semiconductor material layer comprises a second element doped therein, a concentration of the second element doped in the second semiconductor material layer is less than a concentration of the second element doped in the fourth semiconductor material layer.

9. The method of claim 8, further comprising:
after forming the second stack and the third stack, performing a patterning process on the first semiconductor material layer to form a first semiconductor layer exposing the drain region of the base pattern, wherein a portion of the third stack is removed during the patterning process, so that the third stack is formed to have a staircase structure.

10. The method of claim 9, further comprising:
forming an ohmic contact layer on the drain region exposed by the first semiconductor layer, wherein the ohmic contact layer covers the third stack with the staircase structure.

* * * * *